(12) United States Patent
Lippert et al.

(10) Patent No.: US 12,411,417 B2
(45) Date of Patent: Sep. 9, 2025

(54) PROJECTION OBJECTIVE INCLUDING AN OPTICAL DEVICE

(71) Applicant: Carl Zeiss SMT GmbH, Oberkochen (DE)

(72) Inventors: Johannes Lippert, Buch am Wald (DE); Toralf Gruner, Aalen-Hofen (DE); Kerstin Hild, Waldstetten (DE); Hans Michael Stiepan, Aalen (DE); Thilo Pollak, Neresheim (DE); Jeffrey Cavaco, Boylston, MA (US)

(73) Assignee: Carl Zeiss SMT GmbH, Oberkochen (DE)

( * ) Notice: Subject to any disclaimer, the term of this patent is extended or adjusted under 35 U.S.C. 154(b) by 98 days.

(21) Appl. No.: 18/153,640

(22) Filed: Jan. 12, 2023

(65) Prior Publication Data

US 2023/0142187 A1 May 11, 2023

Related U.S. Application Data

(63) Continuation of application No. PCT/EP2021/070949, filed on Jul. 27, 2021.
(Continued)

(30) Foreign Application Priority Data

Nov. 26, 2020 (DE) .......................... 102020131389.6

(51) Int. Cl.
*G03F 7/20* (2006.01)
*G02B 13/16* (2006.01)
(Continued)

(52) U.S. Cl.
CPC ......... *G03F 7/70266* (2013.01); *G02B 13/16* (2013.01); *G02B 26/0825* (2013.01);
(Continued)

(58) Field of Classification Search
CPC ............. G03F 7/70266; G03F 7/70891; G03F 7/70258; G02B 13/16; G02B 26/0825;
(Continued)

(56) References Cited

U.S. PATENT DOCUMENTS 6,388,823 B1 5/2002 Gaber et al.
7,304,717 B2 12/2007 Hummel et al.
(Continued)

FOREIGN PATENT DOCUMENTS

CN 1620731 A 5/2005
DE 102015213275 A1 1/2017
(Continued)

OTHER PUBLICATIONS

German Office Action, with translation thereof, for corresponding DE Appl No. 10 2020 131 389.6, dated Apr. 13, 2021.
(Continued)

*Primary Examiner* — Mesfin T Asfaw
(74) *Attorney, Agent, or Firm* — Fish & Richardson P.C.

(57) ABSTRACT

A projection exposure apparatus comprises a projection objective, and the projection objective comprises an optical device, wherein the optical device comprises an optical element having an optically effective surface and an electrostrictive actuator. The electrostrictive actuator is deformable by a control voltage being applied. The electrostrictive actuator is functionally connected to the optical element to influence the surface shape of the optically effective surface. A control device supplies the electrostrictive actuator with the control voltage. A measuring device is configured, at least at times while the electrostrictive actuator influences the optically effective surface of the optical element, to measure directly and/or to determine indirectly the temperature and/or a temperature change of the electrostrictive actuator and/or the surroundings thereof to take account of
(Continued)

a temperature-dependent influence during driving of the electrostrictive actuator by the control device.

20 Claims, 6 Drawing Sheets

Related U.S. Application Data (60) Provisional application No. 63/058,745, filed on Jul. 30, 2020.

(51) Int. Cl.
*G02B 26/08* (2006.01)
*G03F 7/00* (2006.01)
*H10N 30/20* (2023.01)
*H10N 30/80* (2023.01)

(52) U.S. Cl.
CPC ....... *G03F 7/70891* (2013.01); *H10N 30/206* (2023.02); *H10N 30/802* (2023.02)

(58) Field of Classification Search
CPC .... G02B 7/185; H10N 30/206; H10N 30/802; H10N 30/2027
See application file for complete search history.

(56) References Cited

U.S. PATENT DOCUMENTS

| | | | |
|---|---|---|---|
| 7,492,077 | B2 | 2/2009 | Ealey |
| 9,785,051 | B2 | 10/2017 | Van Schoot et al. |
| 9,915,872 | B2 | 3/2018 | Eisenmenger |
| 10,423,082 | B2 | 9/2019 | Gorkhover |
| 10,684,466 | B2 | 6/2020 | Hakvoort |
| 2002/0048096 | A1 | 4/2002 | Melzer |
| 2019/0094705 | A1* | 3/2019 | Kugler .................. G02B 7/182 |
| 2022/0197157 | A1 | 6/2022 | Jansen et al. |

FOREIGN PATENT DOCUMENTS

| | | |
|---|---|---|
| DE | 102019203423 A1 | 1/2020 |
| EP | 0 408 305 A2 | 1/1991 |
| JP | H04-58208 A | 2/1992 |
| JP | H04-158329 A | 6/1992 |
| JP | 2000-81504 A | 3/2000 |
| JP | 2000-081504 A | 3/2000 |
| JP | 2002-519843 A | 7/2002 |
| JP | 2010-114986 A | 5/2010 |
| JP | 2015-515134 A | 5/2015 |
| JP | 2016-502124 A | 1/2016 |
| JP | 2016-063643 A | 4/2016 |
| JP | 2016-525231 A | 8/2016 |
| NL | 2025093 A | 5/2020 |
| WO | WO 2005/069055 A2 | 7/2005 |
| WO | WO2012/147278 | 11/2012 |
| WO | WO 2012/147278 A1 | 11/2012 |
| WO | WO 2020/207684 A1 | 10/2020 |

OTHER PUBLICATIONS

International Search Report and Written Opinion for corresponding PCT Appl No. PCT/EP2021/070949, dated Nov. 11, 2021.
Japanese Office Action, with translation thereof, for corresponding JP Appl No. 2023-505942, dated Jan. 30, 2024.
Japanese Reconsideration Report, with translation thereof, for corresponding JP Appl No. 2023-505942, dated Oct. 16, 2024.
Office Action in Taiwanese Appln. No. 110127748, mailed on Mar. 20, 2025, 16 pages (with English translation).
Search Report in Taiwanese Appln. No. 110127748, mailed on Mar. 20, 2025, 2 pages (with English translation).

* cited by examiner

PROJECTION OBJECTIVE INCLUDING AN OPTICAL DEVICE

CROSS-REFERENCE TO RELATED APPLICATIONS

The present application is a continuation of, and claims benefit under 35 USC 120 to, international application PCT/EP2021/070949, filed Jul. 27, 2021, which claims priority 35 U.S.C. § 119 to German Patent Application No. 10 2020 131 389.6 filed Nov. 26, 2020. International application PCT/EP2021/070949 also claims priority under 119 (e) to U.S. Provisional Application No. 63/058,745, filed Jul. 30, 2020. The entire disclosure of these applications are incorporated by reference herein.

FIELD

The disclosure relates to a projection exposure apparatus which includes a projection objective which, in turn, includes an optical device, wherein the optical device comprises an optical element having an optically effective surface and at least one electrostrictive actuator, which is deformable by an applied control voltage, and a temperature sensor either directly attached to the optical device or in near proximity. The disclosure also relates to a method to drive a projection exposure apparatus by influencing the surface shape of an optically effective surface of an optical element, wherein the optical element is part of a projection objective, and the projection objective is part of the projection exposure apparatus, according to which the optical element is functionally connected to an electrostrictive actuator. In addition, the disclosure relates to a projection exposure apparatus for semiconductor lithography comprising an illumination system comprising a radiation source and an optical unit, which has at least one optical device.

BACKGROUND

On account of the advancing miniaturization of semiconductor circuits, the desired resolution and accuracy of projection exposure apparatus are increasing. Correspondingly stringent desired properties are made of the optical elements that influence, inter alia, the beam path within the projection exposure apparatus.

In order to achieve a high resolution especially of lithography optical units, EUV light having a wavelength of 13.5 nm can be used in addition to VUV and DUV wavelengths of 248 nm or 193 nm, respectively.

Mirror systems operating either with almost normal incidence or in grazing fashion are typically used in EUV projection exposure apparatuses where mirrors in VUV and DUV systems are used in normal incidence. In general, the achievable resolutions are constantly being increased, thus resulting in correspondingly more stringent desired properties for the wavefront correction. Generally, smaller and smaller effects are gaining in importance, which can result in a growing desire for passive, but also primarily for active, correction mechanisms.

Locally deformable mirrors are known for the operation of projection exposure apparatuses. In this case the local deformation is performed by piezoelectric elements applied as actuators in form of thin plates film or layers, c.f. e.g. US20020048096. Local deformation of mirrors by electrostrictive material, piezoelectric material, piezorestrictive material, pyroresistive material, magnetorestrictive material are known from U.S. Pat. No. 7,492,077.

SUMMARY

The present disclosure seeks to provide an assembly for correcting imaging aberrations of a projection objective of a projection exposure apparatus, wherein the imaging aberrations are correctable with high setting accuracy.

The present disclosure also seeks to provide a method for influencing the surface shape of an optically effective surface of an optical element, wherein the optically effective surface can be influenced with high setting accuracy. The optical element being part of a projection objective, the projection objective being part of a projection exposure apparatus.

The present disclosure also seeks to provide a projection exposure apparatus for semiconductor lithography which comprises a projection objective, the projection objective comprises at least one optical device comprising an optical element in order to correct imaging aberrations with high setting accuracy.

The optical device comprises an optical element having an optically effective surface and at least one electrostrictive actuator, which is deformable by a control voltage being applied. The electrostrictive actuator is functionally connected to the optical element in order to influence the surface shape of the optically effective surface. A control device is provided in order to supply the electrostrictive actuator with the control voltage.

In this context an optical element should be understood to mean a deformable optical element, such as an adaptive optical element. Optionally, the optical element is a lens element, such as a mirror, for example a locally deformable mirror.

The optical element, especially a lens element or a mirror element, is an optical element of a projection objective, and the projection objective is part of a projection exposure apparatus.

In the optical device of the projection exposure apparatus, a measuring device is provided, which is configured, at least at times while the electrostrictive actuator influences the optically effective surface of the optical element, to determine the temperature and/or a temperature change of the electrostrictive actuator and/or the surroundings thereof in order to take account of a temperature-dependent influence during driving of the electrostrictive actuator by the control device.

By virtue of the fact that, according to the disclosure, the temperature and/or a temperature change of the electrostrictive actuator and/or the surroundings thereof are/is determined, it is possible to take account of a temperature-dependent influence during the driving of the electrostrictive actuator.

Optionally, the temperature and/or a temperature change of the electrostrictive actuator and/or the surroundings are/is measured directly and/or determined indirectly.

The data of the measuring device can be used to determine a parasitic effect on the surface (e.g. a bimetallic effect) and/or a change in the refractive index of the optical element.

The data of the measuring device can make it possible to drive the electrostrictive actuator with high accuracy. A precise desired property for the applied electrical control voltage and/or the electric field strength can be derived on the basis of the desired surface shape.

The measuring device can make it possible to measure a temperature distribution in the electrostrictive actuator itself and/or in the surroundings of the electrostrictive actuator.

The surroundings of the electrostrictive actuator should be understood to mean a region brought close to the electrostrictive actuator in such a way that from the temperature thereof it is possible to derive a temperature of the electrostrictive actuator and/or a temperature change of the electrostrictive actuator.

In the context of the disclosure, provision can be made for the temperature and/or the temperature change to be measured. In the context of the disclosure, it is not absolutely necessary to measure an absolute temperature; it may be sufficient to measure a temperature change in order to be able to take account of temperature-dependent influences during driving of the electrostrictive actuator.

The optical device of the projection exposure apparatus can make it possible to reduce a temperature-dependent influence, for example an influence as a result of the irradiation of the optical element or resulting from the heat caused by the electrostrictive actuator during operation.

In the context of the solution according to the disclosure, it may be sufficient to influence regions or sections of the optically effective surface via the at least one electrostrictive actuator.

In the context of the solution according to the disclosure, it may be sufficient for the electrostrictive actuator to be functionally connected to the optical element in such a way that the surface shape of the optically effective surface is influenceable at least in a defined region.

According to the disclosure, provision can be made for the electrostrictive actuator to be deformable, for example expandable and/or shrinkable, by a control voltage being applied.

The control device can be configured, taking account of the data of the measuring device, to set a desired deformation of the optically effective surface of the optical element and to correspondingly drive the electrostrictive actuator for this purpose.

Expansion constants of electrostrictive material can be relatively greatly temperature-dependent. As a result of the measurement of the temperature and/or the temperature change and/or the temperature distribution of the electrostrictive actuator, the reaction of the actuator material to the temperature change can be concomitantly included in the control of the actuator.

All measuring methods proposed in the context of the present disclosure can be used as alternatives or else in any desired combination. It is thus also possible to combine more than two measuring methods with one another.

The temperature and/or the temperature change ascertained in the context of the solution according to the disclosure can be used to detect and/or to determine the temperature distribution in the surroundings of the electrostrictive actuator and/or in the electrostrictive actuator in order to take account of a temperature-dependent influence during driving of the electrostrictive actuator in a targeted manner.

It can be desirable for the measuring device to measure at least one of the following variables,
  the temperature and/or the temperature change of the electrostrictive actuator and/or
  the temperature and/or the temperature change in the surroundings of the electrostrictive actuator and/or
  temperature-dependent properties of the electrostrictive actuator, and/or
  the change of the surface shape of at least one of the surfaces of the optical element in the case of a specific control voltage applied to the electrostrictive actuator.

From the data of the measuring device, for example the ascertained temperature and/or the temperature change, the deformation of the optically effective surface can be deduced for example via simulation and/or via previously calculated tables and/or via calibration. The simulation can contain, for example, a finite element analysis (FE calculation) on the basis of a material model and the specific design of the overall components, for example the holding structures, an adhesive or a soldered connection, possible components for position measurement and the like.

The changes in the optically effective surface can be converted into aberrations of the projection objective.

It can be desirable for the electrostrictive actuator is designed such that applying the control voltage results in a lateral deformation of the electrostrictive actuator in the plane of the electrostrictive actuator.

Provision can be made for the control device to be configured, on the basis of the data ascertained by the measuring device, to adapt a value for an m31- or d31-coefficient, characterizing the transverse electrostrictive effect, for driving the electrostrictive actuator in order to take account of the temperature-dependent influence.

It has proved to be suitable if, on the basis of the measurement variables ascertained, a present value for the m31 or d31-coefficient of the piezoelectric tensor is ascertained and taken into account during the driving of the electrostrictive actuator.

It can be desirable for the measuring device measures continuously during the operation of the electrostrictive actuator.

It is possible for the measuring device to measure only at times during the operation of the electrostrictive actuator, but it has proved to be desirable for the measuring device to measure continuously during the operation of the electrostrictive actuator, such that measurement can be effected in a temporally and spatially resolved manner during operation.

Optionally, measurements can be carried out in pauses in operation of the projection exposure apparatus, such as regularly occur in a manner governed by manufacturing, e.g. when changing the semiconductor substrate or the mask or the setting of the illumination system of the projection exposure apparatus.

According to the disclosure, provision can be made for the control device to be configured to take account of thermal changes of material parameters within the electrostrictive actuator and/or of components in the surroundings of the electrostrictive actuator.

By virtue of the fact that the control device takes account of thermal changes of material parameters within the electrostrictive actuator and/or of components in the surroundings of the electrostrictive actuator, temperature-dependent influences during the driving of the electrostrictive actuator can be comprehensively taken into account. The electrostrictive actuator can thus be driven with a relatively high setting accuracy.

It has been recognized that it can be desirable to take account of the thermal change in the stiffness and/or the thermal expansion of the adhesive or of the soldered connection during the driving of the electrostrictive actuator. Temperature-dependent influences of the adhesive or of the soldered connection, too, can thus be taken into account during the driving of the electrostrictive actuator in a desirable manner. It is also additionally possible, if appropriate, to take account of thermally governed changes in the stiffness and/or expansion of further components involved, for example also of the substrate of the optical element.

The electrostrictive actuator can also be secured to the optical element differently; in this case, too, a temperature-dependent change in the securing material and/or the thermal expansion thereof can then be taken into account.

An arrangement of the electrostrictive actuator at a rear side of the optical element facing away from the optically effective surface has proved to be suitable for influencing the optically effective surface if the optical element is a mirror of a projection objective, the projection objective being part of a projection exposure apparatus.

In the above context of an optical element being part of a projection objective, the projection objective being part of a projection exposure apparatus, it may be sufficient if the electrostrictive actuator is arranged in a region of the rear side of the optical element.

According to the disclosure, provision can furthermore be made for the electrostrictive actuator to be arranged on the optically effective surface of the optical element outside a light region or on a side surface of the optical element.

The arrangement of the electrostrictive actuator on the optically effective surface of the optical element outside a light region may be suitable as an alternative or in addition to an arrangement on the rear side of the optical element. It can be desirable, when the electrostrictive actuator is used in the case of lens elements, for the arrangement on the optically effective surface of the optical element to be outside a light region. However, it is possible, in the case of lens elements as well, to arrange the electrostrictive actuator at a rear side facing away from the optically effective surface, for example outside a light region. In addition, or as an alternative thereto, it is also possible to arrange the electrostrictive actuator on a side surface of the optical element.

According to the disclosure provision can be made for the electrostrictive actuator to have a plurality of electrostrictive components.

The embodiment of the electrostrictive actuator having a plurality of electrostrictive components has proved to be suitable for influencing, for example also locally influencing, for example deforming the optically effective surface in a suitable manner.

By virtue of the embodiment of the electrostrictive actuator having a plurality of electrostrictive components, it is possible to determine a temperature distribution for example by measuring and/or determining the temperature of the individual electrostrictive elements or of groups of electrostrictive components. In this case, a temperature and/or a temperature change can be measured and/or determined.

The electrostrictive actuator can be embodied as an electrostrictive mat.

The electrostrictive actuator or the electrostrictive mat can be embodied from a suitable material, for example lead magnesium niobate (PMN), or comprise this material.

The electrostrictive actuator can have electrostrictive components arranged in a regular pattern.

The electrostrictive actuator or the electrostrictive components of the electrostrictive actuator can each have a multilayered construction.

According to the disclosure, provision can be made for the measuring device to measure a capacitance and/or an electrical resistance and/or a frequency-dependent impedance of the electrostrictive actuator.

Is has been recognized that it can be desirable to measure temperature-dependent properties of the electrostrictive actuator or of the individual electrostrictive components. The temperature and/or the temperature change of the electrostrictive actuator can then be determined and/or reckoned back on the basis of the measured variables. On the basis of the relationship between the temperature change and the $m31$- or $d31$-coefficient, it is possible to determine a correspondingly suitable value for the $m31$- or $d31$-coefficient for the driving of the electrostrictive actuator.

In the context of the disclosure, it is not necessary to determine a temperature and/or a temperature change directly. The temperature and/or the temperature change of the electrostrictive actuator can also be determined indirectly by temperature-dependent properties being measured. For this purpose, it has proved to be suitable to measure the local capacitance, the local electrical resistance and/or the local frequency-dependent impedance of the electrostrictive actuator or of the individual electrostrictive components or of a group of electrostrictive components of the electrostrictive actuator. Other temperature-dependent properties can also be measured.

The measurement of temperature-dependent properties, for example the capacitance, can result in no or only few temperature sensors are involved. In addition, the measurement can be carried out directly in the electrostrictive actuator itself, such that the measurement is correspondingly accurate.

According to the disclosure, provision can be made for the measuring device to have an infrared camera for temperature detection and/or an electrical bridge circuit for measuring temperature-dependent properties of the electrostrictive actuator.

The temperature measurement and/or a measurement of a temperature change can be carried out via an infrared camera, for example, which captures the entire area or partial regions of the optical element on which the electrostrictive actuator acts. In this case, the measurement can be carried out continuously during operation.

Alternatively, or additionally, at least one electrical bridge circuit can be used. The bridge circuit can be operated with an AC voltage of variable frequency.

According to the disclosure, provision can furthermore be made for the measuring device to comprise temperature sensors, which measure the temperature and/or the temperature change and/or the temperature distribution of the electrostrictive actuator and/or the surroundings thereof.

In so far as temperature sensors (plural) are mentioned, an embodiment of the disclosure is involved. In each case just a single temperature sensor can also be provided instead of a plurality of temperature sensors.

A measurement of the temperature and/or of the temperature change of the electrostrictive actuator have proved to be suitable for obtaining a temporally and spatially resolved measurement result during operation.

A temperature distribution of the electrostrictive actuator and/or the surroundings thereof can be determined from the measured data.

From the measured data, the deformation of the optically effective surface can be deduced via simulation, via previously calculated tables or via calibration.

On the basis of a predetermined relationship between temperature and the $m31$- or $d31$ coefficient, the temperature measurement can be used to ascertain a present temperature-dependent value for the $m31$- or $d31$-coefficient in a temporally and spatially resolved manner.

The temperature sensors make it possible to measure a locally and temporally varying temperature field in order to ascertain on the basis of these measurement variables a present value for the m31- or d31-coefficient of the piezoelectric tensor, which can be taken into account during the driving of the electrostrictive actuator or of the individual electrostrictive components of the electrostrictive actuator.

It is also possible to measure groups of electrostrictive components.

It can be desirable for the temperature sensors are arranged at the rear side of the electrostrictive actuator facing away from the optical element.

Alternatively, or additionally, according to the disclosure, provision can be made for the temperature sensors to be arranged at a side, such as a side facing the electrostrictive actuator (for example the rear side), of the optical element between electrostrictive components of the electrostrictive actuator.

Provision can be made for the temperature sensors to be arranged locally between the rear side of the optical element and the electrostrictive components of the electrostrictive actuator and/or at the rear side of the electrostrictive actuator or of the electrostrictive components. In the context of the disclosure, it is not necessary for a temperature sensor to be assigned to each electrostrictive component. It may be sufficient if temperature sensors are provided at regular intervals or if a respective temperature sensor is assigned to groups of electrostrictive components. In this case, the temperature sensor can be arranged between two electrostrictive components and/or at the rear side of one of the electrostrictive components.

According to the disclosure, provision can be made for the temperature sensors to be configured to enable a resistance-based measurement in such a way that the temperature sensors comprise a material whose resistance varies measurably with the temperature.

It can be desirable for the temperature sensors to be configured to measure a temperature change of 0.1 K or greater, such as of 0.03 K or greater, for example of 0.01 K or greater.

The abovementioned configuration of the temperature sensors has proved to be suitable for ascertaining values which enable suitable driving of the electrostrictive actuator or of the individual electrostrictive components of the electrostrictive actuator.

According to the disclosure, provision can be made for supply lines for supplying the electrostrictive actuator with the control voltage and supply lines for supplying the temperature sensors with an operating voltage at least in part are routed jointly and/or are combined functionally and/or physically to form a uniform conduction track and/or to be identical.

For example in combination with an adapted control device, it can be desirable to use as feed lines for the temperature sensors substantially those connections which also supply the electrostrictive components with the control voltage.

The inventors have recognized that it can be desirable for the electrical supply lines of the electrostrictive components and the electrical lines for the measurement signal of the temperature sensors to be routed jointly at least over partial sections, for example for them to be combined functionally and/or physically to form a uniform conductor track.

In so far as other sensors or other measuring points are provided in addition or as an alternative to the temperature sensors, they can be supplied with electrical voltage in a comparable manner, if appropriate.

In the context of the disclosure, it can be provided that, the optical device is used in the case of a projection exposure apparatus, a measuring system is introduced when the semiconductor substrate (wafer) is changed, the measuring system measuring the image. On the basis of the measurement, it is then possible to carry out corresponding corrections during the driving of the electrostrictive actuator.

In the context of the disclosure, it can be provided that, during the changing of the semiconductor substrate (wafer), firstly the actual state is measured and then a defined voltage is applied to the electrostrictive actuator. Afterward, the change is measured, as a result of which it is possible to attribute the change to the deformation of the optically effective surface of the optical element, for example of a mirror. The extent to which the optically effective surface has deformed can then be deduced from the measurement result. It is then also possible to determine therefrom what temperature is present, since the deviations with respect to the expected result from the temperature change. The difference between the expected measurement result and the measured measurement result can be attributed to the temperature, for which reason it is possible in this way, too, to determine the temperature and/or a temperature change and then to drive the electrostrictive actuator accordingly, such that the temperature change can be compensated for and the setting accuracy can thus be improved.

It can be desirable for the control device, on the basis of the data of the measuring device, to ascertain an expected wavefront effect as a result of the change in the surface shape and/or a change in the refractive index, and to take account of the wavefront effect during the driving of the electrostrictive actuator and/or of at least one compensation mechanism.

The inventors have recognized that it can be desirable for, on the basis of the measurement information, a location-dependent temperature distribution of the optical element is updated, this to be used to ascertain an expected wavefront effect as a result of surface deformation and/or a change in the refractive index and this wavefront change is taken into account during the driving of at least one compensation mechanism for small aberrations. The compensation mechanism can be not only the electrostrictive actuator but also or alternatively other actuators of the optical device and/or of an optical system.

According to the disclosure, provision can be made for the compensation mechanism to be embodied as elements displaceable in the light direction or perpendicularly thereto and/or as elements rotatable about the light direction or about axes perpendicular thereto and/or as deformable elements and/or as locally heatable elements and/or as locally coolable elements and/or as elements displaceable relative to one another, such as aspherized plates, and/or as exchangeable elements.

The abovementioned compensation mechanism has proved to be suitable.

The measuring methods mentioned in the context of the disclosure can be used alternatively or additionally. This also applies, for example, to combinations of methods for directly measuring a temperature, a temperature change or a temperature distribution and methods in which temperature-dependent properties of the electrostrictive actuator or of the individual electrostrictive components are measured and then a temperature, a temperature change or a temperature distribution is determined from the measured values.

The abovementioned method which involves measuring the change of the surface shape in the case of a specific voltage applied to the electrostrictive actuator can also be used in combination with the other abovementioned measuring methods.

It can be desirable fro the optical element to be a mirror, such as a locally deformable mirror, for example of a projection exposure apparatus.

The optical device according to the disclosure can be suitable therefor.

With regard to the configurations and developments of a projection exposure apparatus of this type, reference is correspondingly made to the explanations mentioned above and also the explanations hereinafter.

The optical element is embodied as a lens element or mirror of a projection objective the projection objective being part of a projection exposure apparatus.

The disclosure furthermore relates to a method for influencing the surface shape of an optically effective surface of an optical element, according to which the optical element is functionally connected to an electrostrictive actuator, according to which the electrostrictive actuator, when the latter is supplied with a control voltage, is suitable for influencing the surface shape of the optically effective surface. According to the disclosure, provision is made, at least at times while the electrostrictive actuator influences the optically effective surface of the optical element, that the temperature and/or a temperature change of the electrostrictive actuator and/or the surroundings thereof is measured directly and/or determined indirectly in order to take account of a temperature-dependent influence during the driving of the electrostrictive actuator. The optical element being part of a projection objective the projection objective being part of a projection exposure apparatus.

The method according to the disclosure can make it possible to take account of the temperature and/or a temperature change of the electrostrictive actuator or of the individual electrostrictive components of the electrostrictive actuator during the driving of the electrostrictive actuator and also to determine a temperature distribution therefrom. The surface shape of the optically effective surface can thus be influenced relatively exactly. The electrostrictive actuator being connected to an optical element, the optical element being part of a projection objective, the projection objective being part of a projection exposure apparatus.

With regard to further features and configurations, reference is analogously made to the explanations above and also hereinafter concerning the optical device.

It can be desirable the measured data to be used to determine a parasitic effect on the surface shape of the optically effective surface and/or a change in the refractive index of the optical element.

In a method provision can be made for applying an electric voltage to result in a lateral deformation of the electrostrictive actuator in the plane of the electrostrictive actuator, and the measured data to be used to adapt a value for an m31- or d31-coefficient, characterizing the transverse electrostrictive effect, for the driving of the electrostrictive actuator in such a way that temperature-dependent influences are taken into account.

Provision can furthermore be made for the change of the surface shape of at least one of the surfaces of the optical element, such as of the optically effective surface, in the case of a specific control voltage applied to the electrostrictive actuator, to be ascertained, for example via measurable aberrations, and the m31- or d31-coefficient is determined therefrom.

Alternatively, or additionally, it can be desirable fro at least one temperature-dependent variable of the electrostrictive actuator, for example a capacitance and/or an electrical resistance and/or a frequency-dependent impedance, to be determined and the m31- or d31-coefficient of the electrostrictive actuator to be determined therefrom.

From the measured or determined temperature data and/or the data concerning the temperature change, it is possible, in a simple manner, to determine a temperature distribution of the electrostrictive actuator and/or the temperatures and/or the temperature changes of the individual electrostrictive components of the electrostrictive actuator and accordingly to take account of the influences thereof.

From the temperature distribution, as already explained, the deformation of the optically effective surface can be deduced via simulation, via previously calculated look-up tables or via calibration. The simulation can be carried out for example using the methods of finite element analysis (FE calculation) on the basis of a material model. The changes of the optically effective surface can be converted into aberrations, which can be done on the basis of previously calculated sensitivities.

Provision can be made to use the method according to the disclosure for correcting imaging aberrations of a projection exposure apparatus.

The method according to the disclosure can be suitable for correcting imaging aberrations of a projection exposure apparatus for semiconductor lithography, such as an EUV projection exposure apparatus for semiconductor lithography.

The disclosure relates to a projection exposure apparatus for semiconductor lithography comprising an illumination system comprising a radiation source and an optical unit, which has at least one optical device, comprising an optical element for correcting imaging aberrations. In this case, the optical device can be embodied in accordance with the explanations above and below.

The disclosure can be suitable for use with microlithographic DUV ("Deep Ultra Violet") and EUV ("Extreme Ultra Violet") projection exposure apparatuses.

A use of the disclosure also relates to immersion lithography, wherein imaging aberrations can be correctable.

It should additionally be pointed out that terms such as "comprising", "including" or "having" do not exclude other features or steps. Furthermore, terms such as "a(n)" or "the" indicating steps or features in the singular do not exclude a plurality of features or steps—and vice versa.

Exemplary embodiments of the disclosure are described in greater detail below with reference to the drawing.

The figures each show exemplary embodiments illustrating individual features of the present disclosure in combination with one another. Features of one exemplary embodiment are also implementable in a manner detached from the other features of the same exemplary embodiment and can accordingly readily be linked by a person skilled in the art to form further expedient combinations and subcombinations with features of other exemplary embodiments.

BRIEF DESCRIPTION OF THE DRAWINGS

In the figures, functionally identical elements are provided with the same reference signs.

In the figures, schematically.

EXEMPLARY EMBODIMENTS

Figure 1:
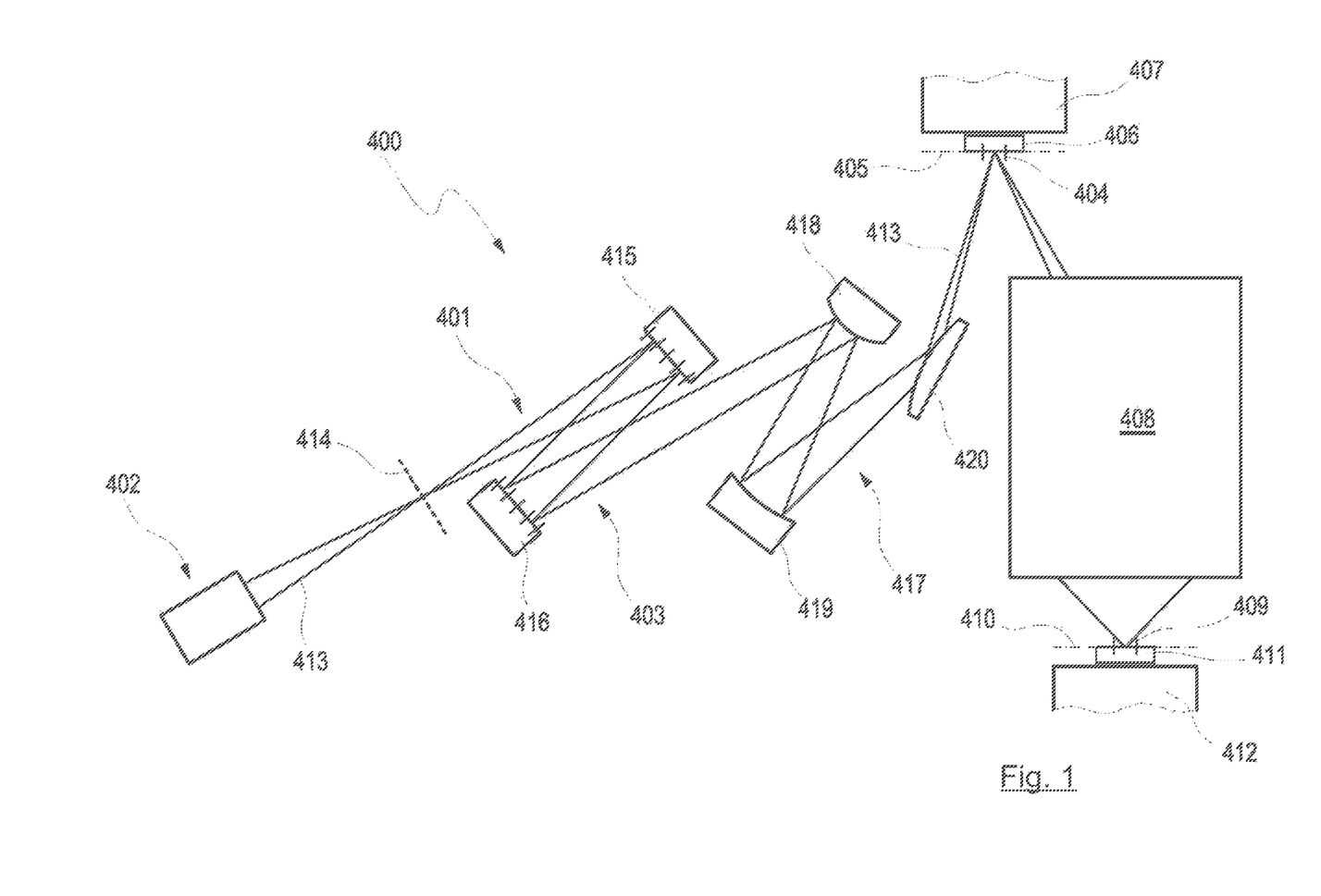
FIG. 1 shows an EUV projection exposure apparatus.

FIG. 1 shows by way of example the basic construction of an EUV projection exposure apparatus 400 for semiconductor lithography, for which the disclosure can find application. An illumination system 401 of the projection exposure apparatus 400 comprises, besides a radiation source 402, an optical unit 403 for illuminating an object field 404 in an object plane 405. A reticle 406 arranged in the object field 404 and held by a reticle holder 407 illustrated schematically is illuminated. A projection objective 408, merely illustrated schematically, serves for imaging the object field 404 into an image field 409 in an image plane 410. A structure on the reticle 406 is imaged onto a light-sensitive layer of a wafer 411 arranged in the region of the image field 409 in the image plane 410, the wafer being held by a wafer holder 412, likewise illustrated as an excerpt. The radiation source 402 can emit EUV radiation 413, for example in the range of between 5 nanometers and 30 nanometers. Optically differently embodied and mechanically adjustable optical elements 415, 416, 418, 419, 420 are used for controlling the radiation path of the EUV radiation 413. In the case of the EUV projection exposure apparatus 400 illustrated in FIG. 1, the optical elements are embodied as adjustable mirrors in suitable embodiments, mentioned merely by way of example below.

The EUV radiation 413 generated by the radiation source 402 is aligned via a collector integrated in the radiation source 402 in such a way that the EUV radiation 413 passes through an intermediate focus in the region of an intermediate focal plane 414 before the EUV radiation 413 impinges on a field facet mirror 415. Downstream of the field facet mirror 415, the EUV radiation 413 is reflected by a pupil facet mirror 416. With the aid of the pupil facet mirror 416 and an optical assembly 417 comprising mirrors 418, 419, 420, field facets of the field facet mirror 415 are imaged into the object field 404.

Figure 2:
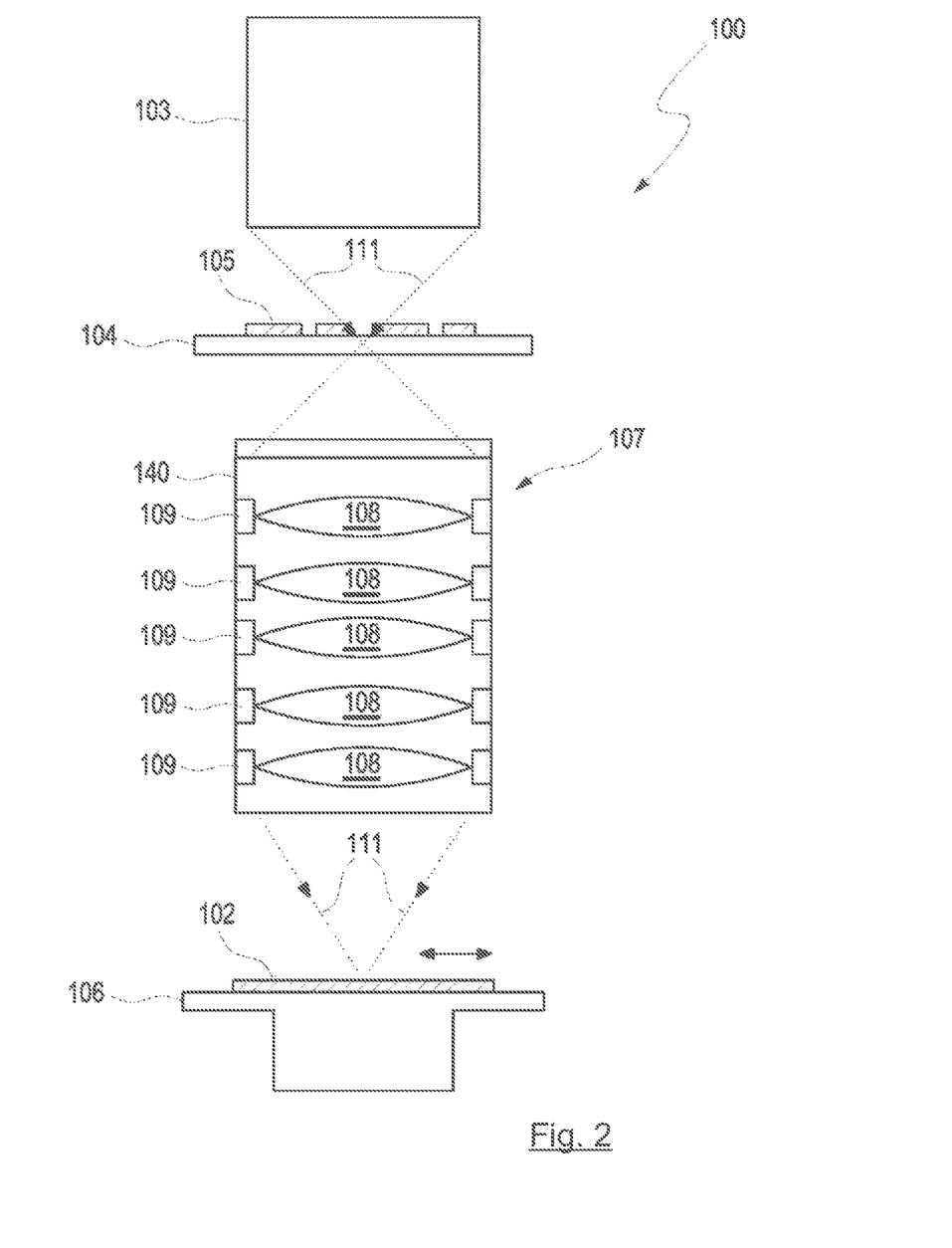
FIG. 2 shows a DUV projection exposure apparatus.

FIG. 2 illustrates an exemplary DUV projection exposure apparatus 100. The projection exposure apparatus 100 comprises an illumination system 103, a device—called a reticle stage 104 — for receiving and exactly positioning a reticle 105 used for determining the later structures on a wafer 102, a wafer holder 106 for mounting, moving and exactly positioning the wafer 102, and an imaging device, namely a projection objective 107, comprising a plurality of optical elements 108 held via mounts 109 in a lens housing 140 of the projection objective 107.

The optical elements 108 can be embodied as individual refractive, diffractive and/or reflective optical elements 108, such as e.g. lens elements, mirrors, prisms, terminating plates and the like.

The basic functional principle of the projection exposure apparatus 100 provides for the structures introduced into the reticle 105 to be imaged onto the wafer 102.

The illumination system 103 provides a projection beam 111 in the form of electromagnetic radiation, the projection beam being used to image the reticle 105 onto the wafer 102. A laser, a plasma source or the like can be used as the source of the radiation. The radiation is shaped in the illumination system 103 via optical elements such that the projection beam 111 has the desired properties with regard to diameter, polarization, shape of the wavefront and the like upon impinging on the reticle 105.

Via the projection beam 111, an image of the reticle 105 is generated and is transferred to the wafer 102 in a correspondingly reduced fashion by the projection objective 107. In this case, the reticle 105 and the wafer 102 can be moved synchronously, such that regions of the reticle 105 can be imaged onto corresponding regions of the wafer 102 practically continuously during a so-called scanning process.

Figure 3:
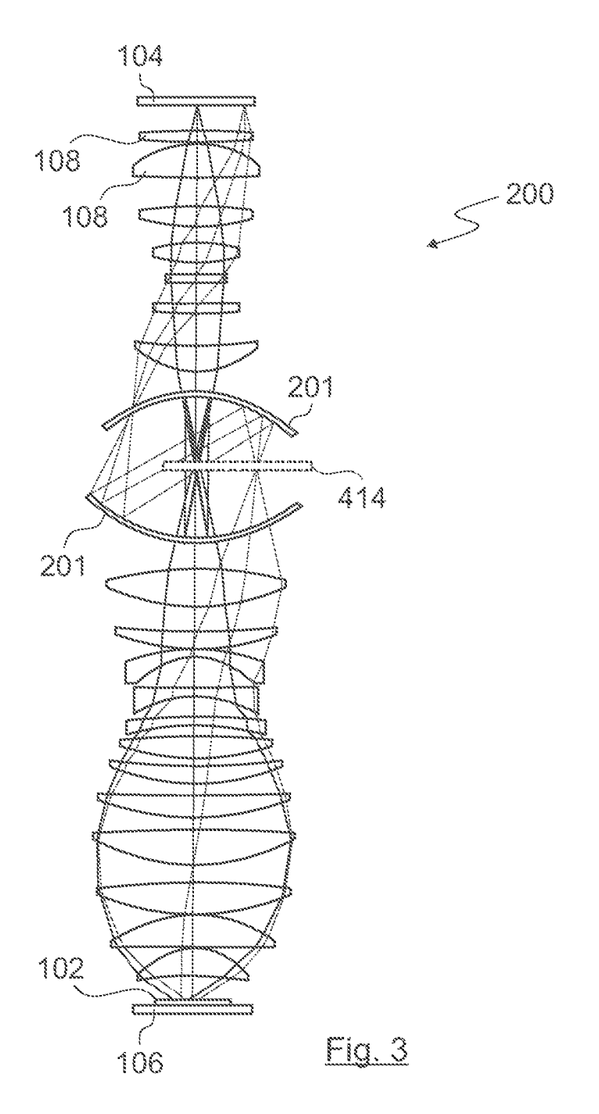
FIG. 3 shows an immersion lithographic projection exposure apparatus.

FIG. 3 illustrates a third projection objective 200 embodied as an immersion lithographic DUV projection exposure apparatus. For further background of such a projection objective 200, reference is made to WO 2005/069055 A2, for example, the corresponding content of which shall be incorporated by reference in the present description; therefore, the exact functioning will not be discussed in detail at this juncture.

What is evident, in a manner comparable with the DUV projection exposure apparatus 100 in accordance with FIG. 2, is a reticle stage 4 used to determine the later structures on the wafer 102 arranged on the wafer holder 106 or wafer stage. For this purpose, the projection objective 200 in FIG. 3 likewise comprises a plurality of optical elements, for example lens elements 108 and mirrors 201.

In the context of the disclosure, however, the reticle 105, 406, the reticle stage 104 or the reticle holder 407, the wafer 102, 411, the wafer holder 106, 412 or further elements in the region of the beam path of the projection exposure apparatus 100, 400 or projection objective 200 can also be referred to as optical elements.

For the correction of imaging aberrations of a projection exposure apparatus, for example of the projection exposure apparatuses 100, 400 or projection objective 200, a targeted deformation of the optical elements 108, 201, 415, 416, 418, 419, 420 thereof may be suitable. Imaging aberrations of an EUV projection exposure apparatus 400 can be corrected efficiently by one or a plurality of mirrors of the projection objective 408 being deformed in a targeted manner.

Two mirrors 201 are provided within the beam path of the projection objective 200, an intermediate focal plane 414 being situated between the mirrors.

Although the disclosure for the correction of the imaging aberrations is suitable, in principle, for the deformation of arbitrary optical elements of arbitrary projection objectives, the disclosure can be used for example for the deformation of optical elements 201, 415, adjacent to an intermediate focal plane 414. Accordingly, for example the mirrors 201 of the immersion lithographic projection objective in FIG. 3 can be embodied as deformable according to the disclosure.

The use of the disclosure is not restricted to use in projection exposure apparatuses 100, 400 or projection objectives 200 for example also not with the construction described.

The disclosure and the following exemplary embodiment should furthermore be understood not to be restricted to a specific design. The following figures illustrate the disclosure merely by way of example and highly schematically.

FIGS. 4 to 7 and FIG. 10 show an optical device 1 comprising an optical element 2 and an electrostrictive actuator 3. The optical device 1 can be part of a projection exposure apparatus 100, 400 or projection objective 200 for semiconductor lithography, for example part of an EUV projection exposure apparatus 400 or of an immersion lithographic DUV projection exposure apparatus 200.

The optical element 2 can be, for example, a lens element or a mirror. Optionally, the optical element 2 is an adaptive optical element, for example a deformable lens element or a deformable mirror, for example of a projection exposure apparatus 100, 400 or projection objective 200 such as of an EUV projection exposure apparatus 400 or of an immersion lithographic DUV projection objective 200. As an example, the optical element 2 is embodied as a mirror 201 of the immersion lithographic DUV projection objective 200 or as a mirror 415, 416, 418, 419, 420 of the EUV projection exposure apparatus 400. For example, the optical element 2 is arranged between the reticle 105, 406 and the wafer 102, 411. Optionally, the optical element 2 is embodied as one of the mirrors of the projection objective 408 of the EUV projection exposure apparatus 400, as a lens element 108 of the DUV projection exposure apparatus 100 or as a lens element 201 of the immersion lithographic DUV projection objective 200.

The optical element 2 according to the disclosure can also be embodied as a lens element 108 of a DUV projection exposure apparatus 100 or of an immersion lithographic DUV projection objective 200.

The optical device 1 can be part of an assembly for correcting imaging aberrations of a projection exposure apparatus 100, 400 or projection objective 200 and for this purpose the optical element 2 is embodied as a lens element or mirror of the projection exposure apparatus 100, 400 or projection objective 200.

The optical device 1 comprising the optical element 2 is illustrated in greater detail in the exemplary embodiments on the basis of a lens element, for example a mirror, for example for a projection exposure apparatus, but is not restricted thereto. The optical device can be an arbitrary optical device 1 comprising an arbitrary optical element 2. The exemplary embodiments should be understood accordingly.

Figure 4:
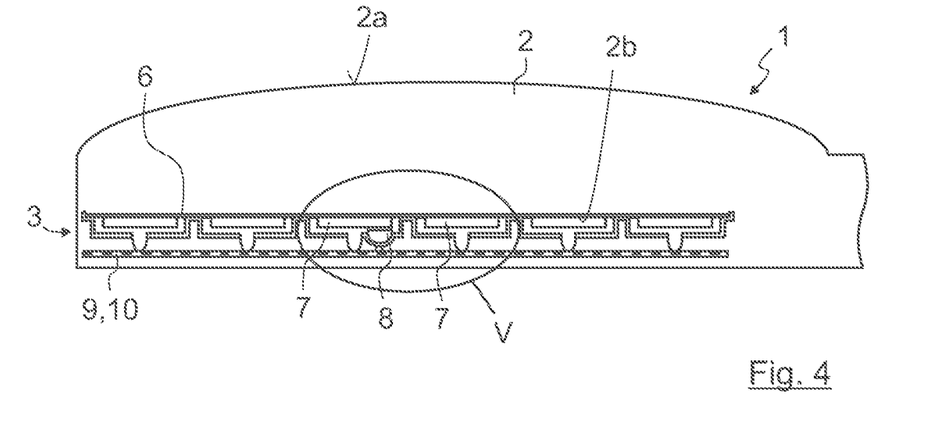
FIG. 4 shows a cross section through an optical device according to the disclosure comprising an optical element and an electrostrictive actuator.

The electrostrictive actuator 3 is fashioned in such a way that it is deformable by a control voltage being applied. The electrostrictive actuator 3 is functionally connected to the optical element 2 in order to influence the surface shape of an optically effective surface 2a of the optical element 2.

A control device 4 is provided in order to supply the electrostrictive actuator 3 with the control voltage. The control device 4 is illustrated schematically in FIG. 10.

Figure 10:
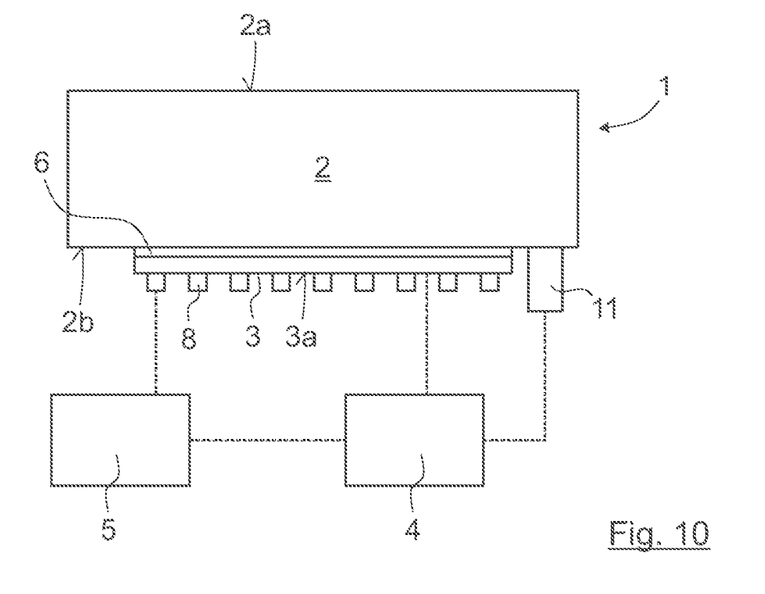
FIG. 10 shows a basic illustration of an optical device comprising an optical element, an electrostrictive actuator, temperature sensors, a measuring device, a control device and a compensation mechanism.

A measuring device 5 is furthermore provided, which is configured, at least at times while the electrostrictive actuator 3 influences the optically effective surface 2a of the optical element 2, to measure directly and/or to determine indirectly the temperature and/or a temperature change of the electrostrictive actuator and/or the surroundings thereof. On the basis of the data and/or the measurement variables, it is then possible to take account of a temperature-dependent influence during driving of the electrostrictive actuator 3.

The control device 4 is configured, taking account of the data of the measuring device 5, to set a desired deformation of the optically effective surface 2a and to drive the electrostrictive actuator correspondingly for this purpose.

The measuring device 5 is illustrated schematically in FIG. 10.

In the exemplary embodiments, provision is made for the measuring device 5 to measure at least one of the following variables,
the temperature and/or the temperature change of the electrostrictive actuator 3 and/or
the temperature and/or the temperature change in the surroundings of the electrostrictive actuator 3 and/or
temperature-dependent properties of the electrostrictive actuator, and/or
the change of the surface shape of at least one of the surfaces 2a of the optical element 2 in the case of a specific electrical voltage applied to the electrostrictive actuator 3, in order, by way of the measurement of the surface shape, to detect a sensor deviation of the temperature sensors via a comparison with known set-point values (for example from a lookup table, etc.), and if appropriate to correct it.

The measurement of the temperature and/or the temperature change in the surroundings of the electrostrictive actuator should be understood to mean that measurement is effected adjacent to the electrostrictive actuator in such a way that the measured temperature or temperature change still enables conclusions to be drawn about a temperature and/or a temperature change of the electrostrictive actuator for example via simulations or previously calculated tables.

Optionally, the measuring device 5 is configured in such a way that it measures continuously during the operation of the electrostrictive actuator 3. In this case, the measurement can also be carried out during pauses in operation of the projection exposure apparatus 100, 400 or projection objective 200, such as e.g. when changing the semiconductor substrate, for example the wafer 411, 102 or the mask of the projection exposure apparatus 100, 400.

Provision can also be made for the measuring device 5 to measure only at times while the electrostrictive actuator 3 influences the optically effective surface 2a of the optical element 2.

In the exemplary embodiments, provision is made for the measuring device 5 to measure and/or to determine a temperature distribution of the electrostrictive actuator 3, for which purpose the measuring device 5 is correspondingly configured and a corresponding number of measurement points are provided.

In the exemplary embodiments, the electrostrictive actuator 3 is embodied in such a way that applying an electrical voltage results in a lateral deformation of the electrostrictive actuator 3 in the plane of the electrostrictive actuator 3.

The control device 4 is configured, on the basis of the data ascertained by the measuring device 5, to adapt a value for an m31- or d31-coefficient, characterizing the transverse electrostrictive effect, for driving the electrostrictive actuator 3 in order to take account of the temperature-dependent influence.

Figure 7:
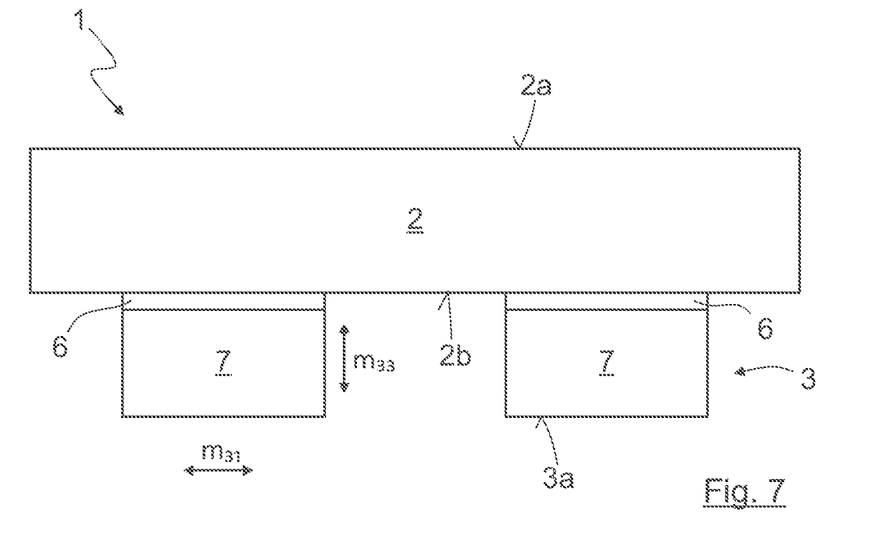
FIG. 7 shows a basic illustration of a cross section through an optical element and an electrostrictive actuator.
Figure 8:
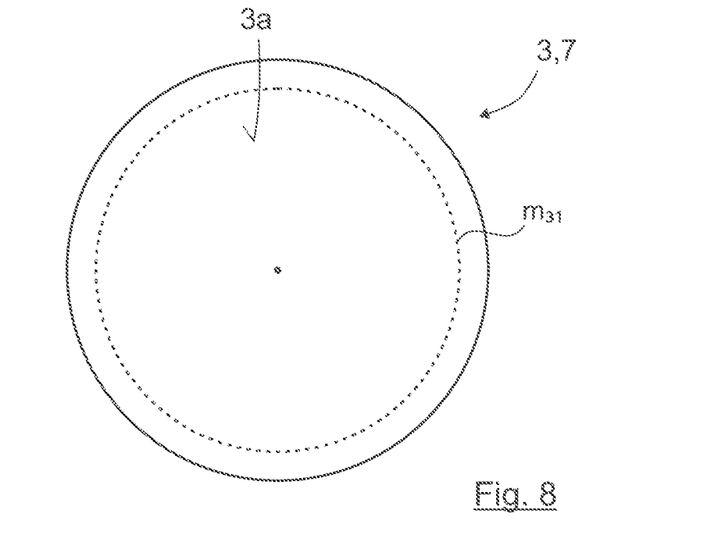
FIG. 8 shows a basic illustration of an electrostrictive component of an electrostrictive actuator for elucidating a lateral deformation of the electrostrictive component or of the electrostrictive actuator.

The m31- or d31-coefficient or its effect (lateral deformation) on the electrostrictive actuator is illustrated in principle in FIGS. 7 and 8. In this case, FIG. 7 also additionally illustrates an m33- or d33-coefficient, but this is only for the sake of completeness. In the exemplary embodiments, provision is made for taking account of the m31- or d31-coefficient rather than the m33- or d33-coefficient.

The control device 4 is configured to take account of thermal changes of material parameters within the electrostrictive actuator 3 and/or of components in the surroundings of the electrostrictive actuator 3.

As is illustrated in FIGS. 4 to 7 and FIG. 10, the electrostrictive actuator 3 can be secured to the optical element 2 via an adhesive 6. Other securing variants are also possible here, for example a soldered connection, but secured via an adhesive 6 or an adhesive layer has proved to be suitable. The optical element being part of a projection objective, the projection objective being part of a projection exposure apparatus.

In the exemplary embodiments, the electrostrictive actuator 3 is arranged at a rear side 2b of the optical element 2 facing away from the optically effective surface 2a.

Alternatively, and/or additionally, the electrostrictive actuator 3 can also be arranged on the optically effective surface 2a of the optical element outside a light region or on a side surface of the optical element 2 (neither is illustrated).

The electrostrictive actuator 3 can extend over a section or a partial region of the rear side 2b of the optical element 2 or else over the complete rear side 2b of the optical element 2. Provision can also be made for using a plurality of electrostrictive actuators 3 distributed in each case over a partial region, such as a partial region of the rear side 2b of the optical element 2.

In the context of the solution according to the disclosure, provision can also be made for the electrostrictive actuator 3 to influence in each case only a section of the optically effective surface 2a of the optical element 2.

In the exemplary embodiments, provision is made for the control device 4 to be configured to take account of the thermal change in the stiffness and the thermal expansion of the adhesive 6 during the driving of the electrostrictive actuator 3. The driving of the electrostrictive actuator 3 can thus be carried out taking account of the effect of temperature changes of the adhesive 6, such that the effects of temperature changes of the adhesive 6 on the optically effective surface 2a of the optical element 2 are taken into account during the driving of the electrostrictive actuator 3. Accordingly, a thermally governed change in the expansion or stiffness of a soldered connection and/or of the substrate of the optical element can also be taken into account.

Figure 9:
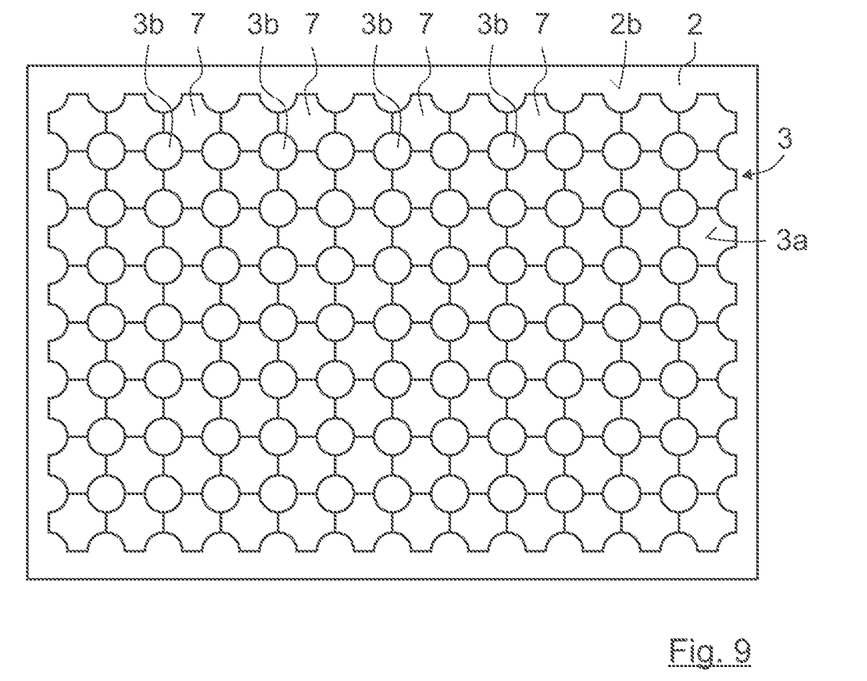
FIG. 9 shows an exemplary illustration of an electrostrictive actuator having a plurality of electrostrictive components.

In the exemplary embodiment, provision is made for the electrostrictive actuator 3 to have a plurality of electrostrictive components 7. This is illustrated by way of example in FIGS. 4 to 7, FIG. 10 and, for example, FIG. 9. The electrostrictive actuator 3 can be embodied as an electrostrictive mat. One or a plurality of actuators 3 can be fitted below the mirror substrate. In this case, the actuators 3 can also be combined in one or a plurality of units. The distribution of the electrostrictive components 7 of the electrostrictive actuator 3, for example in an embodiment as a mat, can be regular, wherein the illustration in FIG. 9 is by way of example for this, but is not limiting.

According to the disclosure, provision can be made for the measuring device 5 to measure temperature-dependent properties of the electrostrictive actuator 3, for example a capacitance and/or an electrical resistance and/or a frequency-dependent impedance of the electrostrictive actuator.

In the exemplary embodiment, provision can also be made for the measuring device 5 to have an infrared camera for temperature detection and/or an electrical bridge circuit for measuring temperature-dependent properties of the electrostrictive actuator 3. The abovementioned variants are not illustrated in the exemplary embodiments, but are implementable for the person skilled in the art. The abovementioned measuring methods can be used alternatively or additionally.

In the exemplary embodiment, as illustrated in FIGS. 4 to 7 and in FIG. 10, provision is made for the measuring device 5 to comprise temperature sensors 8, which measure the temperature and/or the temperature change and/or the temperature distribution of the electrostrictive actuator and/or the surroundings thereof.

Figure 5:
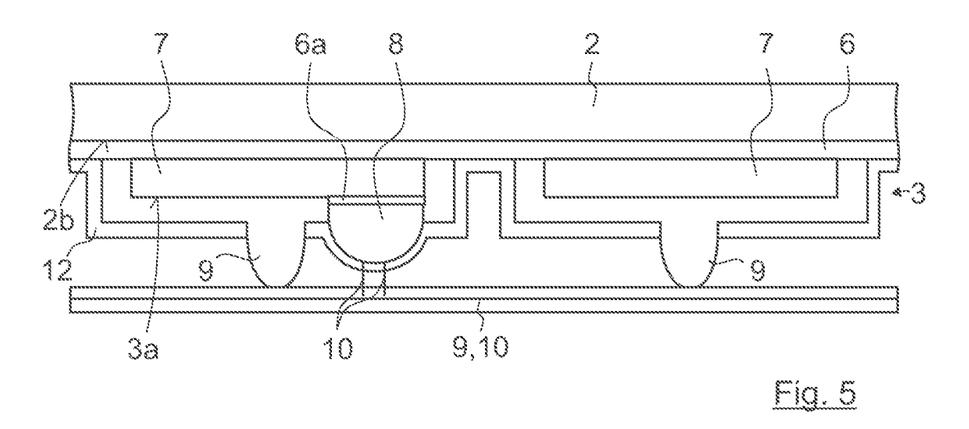
FIG. 5 shows an enlarged illustration of the detail V from FIG. 4.
Figure 6:
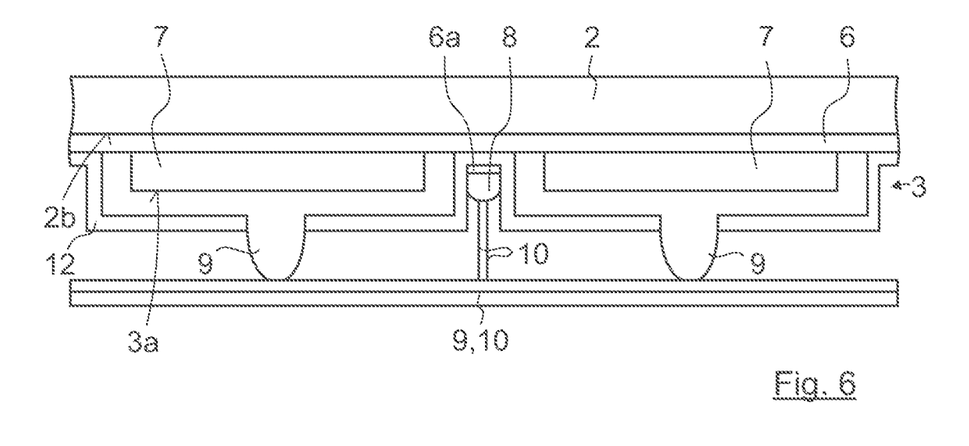
FIG. 6 shows an illustration according to FIG. 5 with an alternative arrangement of a temperature sensor in relation to FIG. 5.

According to the disclosure, provision can be made for a temperature sensor 8 to be assigned to each electrostrictive component 7 or to a group of electrostrictive components. FIGS. 4, 5 and 6 illustrate in each case one temperature sensor 8 by way of example, but a plurality of temperature sensors 8 can also be provided; for example, each of the electrostrictive components 7 can be assigned a temperature sensor 8.

In the exemplary embodiment according to FIGS. 4 and 5, provision is made for the temperature sensors 8 to be arranged at a rear side 3a of the electrostrictive actuator 3 facing away from the optical element 2. In the exemplary embodiment, the temperature sensor 8 is situated specifically at the rear side 3a of one of the electrostrictive components 7 of the electrostrictive actuator 3.

An alternative positioning is illustrated in FIG. 6. In the exemplary embodiment according to FIG. 6, the temperature sensor 8 is positioned at a side of the optical element 2, in the exemplary embodiment at the rear side 2b of the optical element 2 facing the electrostrictive actuator 3, between electrostrictive components 7 of the electrostrictive actuator 3. This is an alternative and/or additional positioning of the temperature sensors 8, which can also be used in combination with the positioning such as is illustrated in FIGS. 4 and 5.

The temperature sensors 8 which can be arranged between electrostrictive components 7 in the exemplary embodiment illustrated in FIG. 6, if the electrostrictive actuator 3 is embodied in a manner corresponding or similar to the variant illustrated in FIG. 9, are arranged in gaps or free spaces 3b of the electrostrictive actuator 3.

The temperature sensors 8 can be configured to enable a resistance-based measurement, for example in such a way that the temperature sensors 8 comprise a material whose resistance varies measurably with temperature. Optionally, the temperature sensors 8 are configured to be able to reliably detect temperature changes of 0.1 K, such as 0.03 K, for example around 0.01 K.

In the exemplary embodiments, provision is made for supply lines 9 for supplying the electrostrictive actuator 3 or the electrostrictive components 7 thereof with the control voltage and supply lines 10 for supplying the temperature sensors 8 with an operating voltage for the measurement at least in part to be routed jointly and/or to be combined to form a uniform conduction track.

In the exemplary embodiments, provision can be made for the control device 4, on the basis of the data of the measuring device 5, to ascertain an expected wavefront effect as a result of the change in the surface shape and/or a change in the refractive index, and to take account of the wavefront effect during the driving of the electrostrictive actuator 3 and/or of at least one compensation mechanism 11.

A compensation mechanism 11 is illustrated schematically in FIG. 10.

In a manner not illustrated in more specific detail, the one or more compensation mechanism 11 can be embodied as elements displaceable in the light direction or perpendicularly thereto and/or as elements rotatable about the light direction or about axes perpendicular thereto and/or as deformable elements and/or as locally heatable elements and/or as locally coolable elements and/or as elements displaceable relative to one another, such as aspherized plates, and/or as exchangeable elements.

FIG. 10 schematically illustrates that the data of the temperature sensors 8 (or the data from some other measuring method or other measuring points) are acquired by the measuring device 5 and made available to the control device 4. The control device 4 can then drive the electrostrictive actuator 3, for example make available a value for an m31- or d31-coefficient, characterizing the transverse electrostrictive effect, for driving the electrostrictive actuator 3 and take account of temperature-dependent influences in the process. As an alternative or in addition thereto, as likewise illustrated in FIG. 10, provision can also be made for the data of the control device 4 to be used to correspondingly drive a compensation mechanism 11 for small aberrations, such that the temperature-dependent influences can correspondingly be taken into account.

FIG. 8 illustrates by way of example a lateral deformation of the electrostrictive actuator 3 in accordance with the m31- or d31-coefficient. The dashed line in FIG. 8 shows the state of the electrostrictive actuator 3 or of an electrostrictive component 7 in a plan view, for example of the rear side 3a after a voltage has been applied. The solid line then shows the state of the electrostrictive actuator 3 or of the electrostrictive component 7 before the voltage is applied.

FIG. 4 shows a construction of the optical device 1, but the solution according to the disclosure is not restricted to this construction.

As already explained, the electrostrictive actuator 3 can be connected to the rear side 2b of the optical element 2 by way of an adhesive 6 or an adhesive layer; this is also correspondingly illustrated in an enlarged fashion in FIG. 5 and FIG. 6.

In the exemplary embodiment, the electrostrictive actuator 3 is composed of a plurality of electrostrictive components 7. The electrostrictive actuator 3 can be embodied as an electrostrictive mat.

The electrostrictive actuator 3 or the electrostrictive components 7 thereof is/are supplied with voltage via supply lines 9 or an electrical contact. In this case, provision can be made for the supply line 9 to lead directly to the electrostrictive components 7. Alternatively, for the direct contacting of the electrostrictive components 7, provision can also be made for an electrical contact or an electrically conductive layer to be embodied at the rear side 3a of the electrostrictive components, which electrical contact or which electrically conductive layer in turn then contacts electrical supply lines, as illustrated in FIGS. 5 and 6.

At the rear side 3a of the electrostrictive actuator 3 or the electrostrictive components 7 thereof, in the exemplary embodiments in accordance with FIGS. 4 to 6, an insulation layer 12 is also provided, which shields the electrical contact or the electrically conductive layer 9 at least partly toward the outside.

FIG. 5 illustrates an arrangement of the temperature sensors 8 at the rear side 3a of the electrostrictive actuator 3. In this case, the supply with voltage is effected by supply lines 10 which, at least in part, are routed jointly with the supply lines 9.

FIG. 6 shows an alternative illustration thereto, wherein provision is made for the temperature sensors 8 to be arranged in gaps or free spaces 3b between electrostrictive components 7 at the rear side 2b of the optical element 2.

Mixtures of FIGS. 5 and 6 are also possible; for example, provision can be made for more temperature sensors 8 to be used, for example for each of the electrostrictive components 7 or a group of electrostrictive components 7 to be assigned a respective temperature sensor 8.

As illustrated in FIGS. 5 and 6, the temperature sensors 8 can be secured via an adhesive layer 6a at the rear side 2b of the optical element 2 or at the rear side 3a of the electrostrictive actuator 3 or the electrostrictive components 7 thereof. The thermal change in the stiffness and/or the thermal expansion of the adhesive 6a and/or of other components involved during the driving of the electrostrictive actuator can likewise be taken into account, if appropriate, during the driving of the electrostrictive actuator. This can be desirable for drift reduction and/or drift correction.

The present exemplary embodiment furthermore also serves for illustrating a method for influencing the surface shape of an optically effective surface 2a of an optical element 2, according to which it is provided that at least at times while the electrostrictive actuator 3 influences the optically effective surface 2a of the optical element 2, the temperature and/or a temperature change and/or a temperature distribution of the electrostrictive actuator 3 and/or the surroundings thereof is measured directly and/or determined indirectly in order to take account of a temperature-dependent influence during the driving of the electrostrictive actuator 3. Optionally, the abovementioned measurement is carried out at least at times while the actuator 3 actively influences the surface 2a of the optical element 2, i.e. while electrical voltage is present at the actuator 3. The measured data can then be used to determine a parasitic effect on the surface shape of the optically effective surface 2a and/or a change in the refractive index of the optical element 2.

What is claimed is:

1. An apparatus, comprising:
a projection objective, comprising:
an optical device;
a controller; and
temperature sensors,
wherein:
the optical device comprises an optical element and an electrostrictive actuator;
the optical element comprises an optically effective surface;
the optical element is adjacent an intermediate image plane of the apparatus;
the controller is configured to provide a control voltage to the electrostrictive actuator to deform the electrostrictive actuator;
the electrostrictive actuator is connected to the optical element to influence a surface shape of the optically effective surface;
the temperature sensors are configured to measure: a) a temperature of the electrostrictive actuator; b) a temperature change of the electrostrictive actuator; c) a temperature distribution of the electrostrictive actuator; d) and/or a temperature distribution of surroundings of the electrostrictive actuator;
the temperature sensors are configured so that, at least at times when the electrostrictive actuator influences the optically effective surface of the optical element, the temperature sensors determine: a) the temperature of the electrostrictive actuator; b) the temperature change of the electrostrictive actuator; and/or c) a temperature of the surroundings the electrostrictive actuator, thereby taking account of a temperature-dependent influence when the electrostrictive actuator is driven by the control device; and
the apparatus is a projection exposure apparatus.

2. The apparatus of in claim 1, wherein the temperature sensors are configured to directly measure a) the temperature of the electrostrictive actuator; b) the temperature change of the electrostrictive actuator; and/or c) the temperature of the surroundings the electrostrictive actuator.

3. The apparatus of in claim 1, wherein the temperature sensors are configured to indirectly determine a) the temperature of the electrostrictive actuator; b) the temperature change of the electrostrictive actuator; and/or c) the temperature of the surroundings the electrostrictive actuator.

4. The apparatus of in claim 1, wherein the temperature sensors are configured to measure at least one of the following variables to indirectly determine the temperature and/or the temperature change:
   temperature-dependent properties of the electrostrictive actuator;
   a change of the surface shape of the optically effective surface; and
   a change of a surface shape of a surface of the optical element other than the optically effective surface.

5. The apparatus of in claim 1, wherein the temperature sensors are configured to continuously measure and/or to continuously determine the temperature and/or the temperature change during use of the electrostrictive actuator.

6. The apparatus of in claim 1, wherein the electrostrictive actuator is configured so that, when the control voltage is applied to electrostrictive actuator, electrostrictive actuator undergoes a lateral deformation in a plane of the electrostrictive actuator.

7. The apparatus of in claim 1, wherein the control device is configured so that, based on data ascertained by the temperature sensors, the control device adapts a value for an m31-or d31-coefficient which characterizes a transverse electrostrictive effect, to drive the electrostrictive actuator to take account of a temperature-dependent influence.

8. The apparatus of in claim 1, wherein the control device is configured to take account of thermal changes of material parameters within the electrostrictive actuator and/or of components in the surroundings of the electrostrictive actuator.

9. The apparatus of in claim 1, further comprising an adhesive or a soldered connection securing the electrostrictive actuator to the optical element, wherein the control device is configured to take account of a thermal change in the stiffness and/or an expansion of the adhesive or the soldered connection when the electrostrictive actuator is driven.

10. The apparatus of in claim 1, wherein the electrostrictive actuator is at a rear side of the optical element, and the rear side faces away from the optically effective surface.

11. The apparatus of in claim 1, wherein the electrostrictive actuator is on the optically effective surface outside a light region, or the electrostrictive actuator is on a side surface of the optical element.

12. The apparatus of in claim 1, wherein the electrostrictive actuator comprises a plurality of electrostrictive components.

13. The apparatus of in claim 1, wherein the temperature sensors are configured to measure a capacitance and/or an electrical resistance and/or a frequency-dependent impedance of the electrostrictive actuator to determine the temperature and/or the temperature change.

14. The apparatus of in claim 1, wherein the temperature sensors comprise an infrared camera configured to detect temperature, and/or wherein the temperature sensors comprise an electrical bridge circuit configured to measure temperature-dependent properties of the electrostrictive actuator.

15. The apparatus of in claim 1, wherein the temperature sensors are at a rear side (3a) of the electrostrictive actuator, and the rear side faces away from the optically effective surface.

16. The apparatus of in claim 1, wherein the electrostrictive actuator comprises electrostrictive components at a side of the optical element, and the temperature sensors are between the electrostrictive components.

17. The apparatus of in claim 1, wherein the temperature sensors are configured to measure a temperature change of 0.1 K or greater.

18. The apparatus of in claim 1, further comprising:
   first supply lines configured to supply the control voltage to the electrostrictive actuator; and
   second supply lines configured to provide an operating voltage to the temperature sensors.

19. The apparatus of in claim 1, wherein:
   the control device is configured so that, based on data from the temperature sensors, the control device ascertains an expected wavefront effect due to the change in the surface shape and/or a change in a refractive index of the optical element; and
   the control device is configured to take account of the wavefront effect when driving the electrostrictive actuator, and/or the control device is configured to take account of a compensation mechanism.

20. The apparatus of claim 1, wherein the temperature sensors are configured so that data collected by the temperature sensors is usable to determine a parasitic effect on the surface shape of the optically effective surface and/or to determine a change in a refractive index of the optical element.

* * * * *

UNITED STATES PATENT AND TRADEMARK OFFICE
CERTIFICATE OF CORRECTION

PATENT NO. : 12,411,417 B2
APPLICATION NO. : 18/153640
DATED : September 9, 2025
INVENTOR(S) : Johannes Lippert et al.

Page 1 of 2

It is certified that error appears in the above-identified patent and that said Letters Patent is hereby corrected as shown below:

In the Specification

Column 3, Line 63, after "actuator" insert -- , --.

Column 3, Line 65, after "actuator" insert -- , --.

Column 6, Line 61, delete "d31coefficient," and insert -- d31-coefficient, --.

Column 9, Line 1, delete "fro" and insert -- for --.

Column 9, Line 64, delete "fro" and insert -- for --.

Column 14, Line 9, after "3" insert -- , --.

Column 14, Line 11, after "3" insert -- , --.

In the Claims

Column 18, Line 63, in Claim 1, after "surroundings" insert -- of --.

Column 19, Line 1, in Claim 2, before "claim" delete "in".

Column 19, Line 5, in Claim 2, after "surroundings" insert -- of --.

Column 19, Line 6, in Claim 3, before "claim" delete "in".

Column 19, Line 10, in Claim 3, after "surroundings" insert -- of --.

Column 19, Line 11, in Claim 4, before "claim" delete "in".

Signed and Sealed this
Twenty-fifth Day of November, 2025

John A. Squires
*Director of the United States Patent and Trademark Office*

Column 19, Line 22, in Claim 5, before "claim" delete "in".

Column 19, Line 26, in Claim 6, before "claim" delete "in".

Column 19, Line 31, in Claim 7, before "claim" delete "in".

Column 19, Line 34, in Claim 7, delete "m31-or" and insert -- m31- or --.

Column 19, Line 37, in Claim 8, before "claim" delete "in".

Column 19, Line 42, in Claim 9, before "claim" delete "in".

Column 19, Line 49, in Claim 10, before "claim" delete "in".

Column 20, Line 1, in Claim 11, before "claim" delete "in".

Column 20, Line 5, in Claim 12, before "claim" delete "in".

Column 20, Line 8, in Claim 13, before "claim" delete "in".

Column 20, Line 13, in Claim 14, before "claim" delete "in".

Column 20, Line 18, in Claim 15, before "claim" delete "in".

Column 20, Line 22, in Claim 16, before "claim" delete "in".

Column 20, Line 26, in Claim 17, before "claim" delete "in".

Column 20, Line 29, in Claim 18, before "claim" delete "in".

Column 20, Line 34, in Claim 19, before "claim" delete "in".